(12) United States Patent
Hamano et al.

(10) Patent No.: US 10,229,830 B2
(45) Date of Patent: Mar. 12, 2019

(54) METHOD OF MANUFACTURING SILICON CARBIDE EPITAXIAL WAFER

(71) Applicant: Mitsubishi Electric Corporation, Tokyo (JP)

(72) Inventors: Kenichi Hamano, Tokyo (JP); Ryo Hattori, Tokyo (JP); Takuyo Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 60 days.

(21) Appl. No.: 15/325,728

(22) PCT Filed: Oct. 14, 2014

(86) PCT No.: PCT/JP2014/077331
§ 371 (c)(1),
(2) Date: Jan. 12, 2017

(87) PCT Pub. No.: WO2016/059670
PCT Pub. Date: Apr. 21, 2016

(65) Prior Publication Data
US 2018/0226246 A1    Aug. 9, 2018

(51) Int. Cl.
*C30B 29/36*   (2006.01)
*H01L 21/02*   (2006.01)
(Continued)

(52) U.S. Cl.
CPC ........ *H01L 21/02378* (2013.01); *C30B 29/36* (2013.01); *G01B 11/0625* (2013.01);
(Continued)

(58) Field of Classification Search
CPC .......... C30B 29/36; C30B 25/02; C30B 25/12; C30B 25/16
See application file for complete search history.

(56) References Cited

U.S. PATENT DOCUMENTS 8,409,349 B2   4/2013   Ohkubo
9,400,172 B2   7/2016   Hattori et al.
(Continued)

FOREIGN PATENT DOCUMENTS

JP   05-113319 A   5/1993
JP   11-142120 A   5/1999
(Continued)

OTHER PUBLICATIONS

International Search Report issued in PCT/JP2014/077331; dated Jan. 13, 2015.
(Continued)

*Primary Examiner* — Robert M Kunemund
(74) *Attorney, Agent, or Firm* — Studebaker & Brackett PC

(57) ABSTRACT

The present invention is aimed at providing a method of manufacturing a silicon carbide epitaxial wafer by which a plurality of silicon carbide epitaxial layers of a predetermined layer thickness can be precisely formed. In the present invention, a first n-type SiC epitaxial layer is formed on an n-type SiC substrate so that the rate of change in impurity concentration between the n-type SiC substrate and the first n-type SiC epitaxial layer will be greater than or equal to 20%. A second n-type SiC epitaxial layer is formed on the first n-type SiC epitaxial layer so that the rate of change in impurity concentration between the first n-type SiC epitaxial layer and the second n-type SiC epitaxial layer will be greater than or equal to 20%.

6 Claims, 4 Drawing Sheets

(51) Int. Cl.
*G01B 11/06* (2006.01)
*H01L 21/66* (2006.01)
*C23C 16/42* (2006.01)
*G01B 9/02* (2006.01)

(52) U.S. Cl.
CPC .. *H01L 21/02447* (2013.01); *H01L 21/02502* (2013.01); *H01L 21/02529* (2013.01); *H01L 21/02576* (2013.01); *H01L 22/12* (2013.01); *C23C 16/42* (2013.01); *G01B 9/02084* (2013.01)

(56) References Cited

U.S. PATENT DOCUMENTS

| 2009/0085044 | A1 | 4/2009 | Ohno et al. | |
|---|---|---|---|---|
| 2014/0239181 | A1* | 8/2014 | Hattori | G01B 11/0625 250/339.08 |

FOREIGN PATENT DOCUMENTS

| JP | 2002-261295 A | 9/2002 |
|---|---|---|
| JP | 2003-065724 A | 3/2003 |
| JP | 2003-109991 A | 4/2003 |
| JP | 2003-234301 A | 8/2003 |
| JP | 2009-088223 A | 4/2009 |
| JP | 2009-302133 A | 12/2009 |
| WO | 2013/061417 A1 | 5/2013 |

OTHER PUBLICATIONS

Notification of Transmittal of Translation of the International Preliminary Report on Patentability (Chapter I) and Translation of Written Opinion of the International Searching Authority; PCT/JP20141077331; dated Apr. 27, 2017.

An Office Action; "Notice of Reasons for Refusal" issued by the Japanese Patent Office on Mar. 7, 2017, which corresponds to Japanese Patent Application No. 2016-553772 and is related to U.S. Appl. No. 15/325,728; with partial English language translation.

An Office Action; "Notification of Reasons for Refusal" issued by the Japanese Patent Office dated Jul. 18, 2017, which corresponds to Japanese Patent Application No. 2016-553772 and is related to U.S. Appl. No. 15/325,728; with partial English language translation.

* cited by examiner

METHOD OF MANUFACTURING SILICON CARBIDE EPITAXIAL WAFER

TECHNICAL FIELD

The present invention relates to a method of manufacturing a silicon carbide epitaxial wafer.

BACKGROUND ART

A silicon carbide (SiC) epitaxial wafer is produced by making an SiC epitaxial layer grow as an SiC active layer (hereinafter, sometimes referred to as "an active epitaxial layer") by an epitaxial crystal growth on an SiC substrate. For the purposes of reducing defects of the active epitaxial layer and the like, between an SiC substrate and an active epitaxial layer, an SiC epitaxial layer differing in growth conditions from the active epitaxial layer is formed as a buffer layer (for example, see Patent Documents 1, 2).

For the measurement of the layer thickness of an SiC epitaxial layer, for example, a reflection interference analysis method using a Fourier transform infrared spectrophotometer (Fourier Transform Infrared Spectroscopy; Abbreviation: FT-IR) (hereinafter, sometimes referred to as "an FT-IR method") is used. Hereinafter, the measurement of the layer thickness of an SiC epitaxial layer by an FT-IR method is sometimes referred to as "the layer thickness measurement by an FT-IR method".

When there is a refractive index difference greater than or equal to a certain degree between an SiC substrate and an SiC epitaxial layer, the interference of light is generated by light reflected at the surface of the SiC epitaxial layer and light reflected at the interface between the SiC epitaxial layer and the SiC substrate. In the layer thickness measurement by an FT-IR method, by utilizing the interference of light, the layer thickness of the SiC epitaxial layer is derived.

PRIOR ART DOCUMENTS

Patent Documents

Patent Document 1: Japanese Patent Application Laid-Open No. 2002-261295
Patent Document 2: Japanese Patent Application Laid-Open No. 2003-234301

SUMMARY OF INVENTION

Problems to be Solved by the Invention

An SiC epitaxial wafer used as a wafer for power semiconductors is produced by making an SiC epitaxial layer, which is relatively low in the impurity concentration, grow as an active epitaxial layer on an SiC substrate, which is relatively high in the impurity concentration.

The difference in the refractive index between an SiC substrate and an active epitaxial layer can be sufficiently secured as long as the difference in the impurity concentration between the SiC substrate and the active epitaxial layer is sufficiently secured. Accordingly, by the layer thickness measurement by an FT-IR method, it is possible to measure the layer thickness of an SiC epitaxial layer which constitutes an active epitaxial layer.

However, in the case where a buffer layer is arranged between an active epitaxial layer and an SiC substrate, it becomes difficult to measure the layer thickness of an SiC epitaxial layer which constitutes the active epitaxial layer and the layer thickness of an SiC epitaxial layer which constitutes the buffer layer.

For example, in the case where, between an active epitaxial layer and an SiC substrate, a buffer layer having an impurity concentration close to the impurity concentration of the active epitaxial layer is arranged, the difference in the refractive index between the active epitaxial layer and the buffer layer is not sufficiently secured, and the reflection of light at the interface between the active epitaxial layer and the buffer layer becomes difficult to be obtained.

On this account, in the layer thickness measurement by an FT-IR method, the active epitaxial layer and the buffer layer become difficult to be distinguished from each other, and since the active epitaxial layer and the buffer layer are regarded as one unit, a layer thickness of the active epitaxial layer and a layer thickness of the buffer layer are summed up to determine a measured value. Accordingly, an SiC epitaxial layer which constitutes the active epitaxial layer and an SiC epitaxial layer which constitutes the buffer layer cannot be individually measured for the layer thickness.

Moreover, in the case where, between an active epitaxial layer and an SiC substrate, a buffer layer having an impurity concentration close to the impurity concentration of the SiC substrate is arranged, since the difference in the refractive index between the SiC substrate and the buffer layer is not sufficiently secured, the reflection of light at the interface between the SiC substrate and the buffer layer becomes difficult to be obtained. On this account, in the layer thickness measurement by an FT-IR method, the case where a buffer layer exists on an SiC substrate and the case where no buffer layer exists on an SiC substrate become difficult to be distinguished from each other, and it is regarded that no buffer layer exists on the SiC substrate. Accordingly, an SiC epitaxial layer which constitutes the buffer layer cannot be measured for the layer thickness.

As described above, in the case where a plurality of SiC epitaxial layers are formed on an SiC substrate, since respective SiC epitaxial layers are difficult to be measured for the layer thickness, it is difficult to make respective SiC epitaxial layers have a predetermined layer thickness. Accordingly, there is a problem that an SiC epitaxial layer of a predetermined layer thickness cannot be precisely formed.

An object of the present invention is to provide a method of manufacturing a silicon carbide epitaxial wafer by which a plurality of silicon carbide epitaxial layers of a predetermined layer thickness can be precisely formed.

Means for Solving the Problems

The method of manufacturing a silicon carbide epitaxial wafer according to the present invention is characterized as including a first layer-forming step of forming a first silicon carbide epitaxial layer by an epitaxial crystal growth on the surface part at one side in the thickness direction of a silicon carbide substrate; a second layer-forming step of forming a second silicon carbide epitaxial layer by an epitaxial crystal growth on the surface part at one side in the thickness direction of the first silicon carbide epitaxial layer formed; and a measuring step of measuring layer thicknesses of the first silicon carbide epitaxial layer and the second silicon carbide epitaxial layer by a reflection interference analysis using a Fourier transform infrared spectrophotometer, wherein, in the first layer-forming step, the first silicon carbide epitaxial layer is formed so that the rate of change in impurity concentration between the silicon carbide substrate and the first silicon carbide epitaxial layer will be greater than or equal to 20%, and in the second layer-forming step, the second silicon carbide epitaxial layer is formed so that the rate of change in impurity concentration between the first silicon carbide epitaxial layer and the second silicon carbide epitaxial layer will be greater than or equal to 20%.

Effects of the Invention

According to the method of manufacturing a silicon carbide epitaxial wafer of the present invention, in the first layer-forming step, a first silicon carbide epitaxial layer is formed by an epitaxial crystal growth on the surface part at one side in the thickness direction of a silicon carbide substrate. In the second layer-forming step, a second silicon carbide epitaxial layer is formed by an epitaxial crystal growth on the surface part at one side in the thickness direction of the first silicon carbide epitaxial layer formed. In the measuring step, layer thicknesses of the first silicon carbide epitaxial layer formed and the second silicon carbide epitaxial layer formed are measured by a reflection interference analysis using a Fourier transform infrared spectrophotometer.

In the first layer-forming step, the first silicon carbide epitaxial layer is formed so that the rate of change in impurity concentration between the silicon carbide substrate and the first silicon carbide epitaxial layer will be greater than or equal to 20%. Moreover, in the second layer-forming step, the second silicon carbide epitaxial layer is formed so that the rate of change in impurity concentration between the first silicon carbide epitaxial layer and the second silicon carbide epitaxial layer will be greater than or equal to 20%.

That is, when layer thicknesses of the first silicon carbide epitaxial layer and the second silicon carbide epitaxial layer are measured in the measuring step, the rate of change in impurity concentration between the silicon carbide substrate and the first silicon carbide epitaxial layer is greater than or equal to 20%, and the rate of change in impurity concentration between the first silicon carbide epitaxial layer and the second silicon carbide epitaxial layer is greater than or equal to 20%.

This enables a peak attributed to light reflected at the interface between the silicon carbide substrate and the first silicon carbide epitaxial layer and a peak attributed to light reflected at the interface between the first silicon carbide epitaxial layer and the second silicon carbide epitaxial layer to be separated from each other in a reflection interference analysis using a Fourier transform infrared spectrophotometer. Accordingly, layer thicknesses of the first silicon carbide epitaxial layer and the second silicon carbide epitaxial layer can be individually measured.

On that account, since enabling layer thicknesses of the first silicon carbide epitaxial layer and the second silicon carbide epitaxial layer to be individually measured facilitates the management of layer thicknesses of the first silicon carbide epitaxial layer and the second silicon carbide epitaxial layer, a plurality of silicon carbide epitaxial layers of a predetermined layer thickness can be precisely formed.

The purpose, features, embodiments and advantages of the present invention will be further elucidated with reference to the following detailed description and attached drawings.

DESCRIPTION OF EMBODIMENTS

Figure 1:
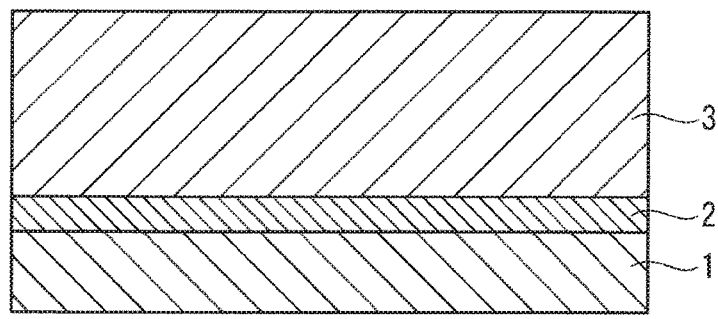
FIG. 1 is a sectional view showing the configuration of a silicon carbide epitaxial wafer 10 produced by a method of manufacturing a silicon carbide epitaxial wafer in accordance with one embodiment of the present invention.

FIG. 1 is a sectional view showing the configuration of a silicon carbide epitaxial wafer 10 produced by a method of manufacturing a silicon carbide epitaxial wafer in accordance with one embodiment of the present invention. In FIG. 1, as one example, the silicon carbide (SiC) epitaxial wafer 10 in which a first n-type silicon carbide (SiC) epitaxial layer 2 and a second n-type SiC epitaxial layer 3 are layered in this order on the surface part at one side in the thickness direction of an n-type silicon carbide (SiC) substrate 1 is shown. The first n-type SiC epitaxial layer 2 and the second n-type SiC epitaxial layer 3 are formed by an epitaxial crystal growth. In FIG. 1, the upward direction side of a paper surface corresponds to one side in the thickness direction.

The method of manufacturing an SiC epitaxial wafer 10 according to the present embodiment includes a first layer-forming step, a second layer-forming step and a measuring step. First, in the first layer-forming step, a first n-type SiC epitaxial layer 2 which constitutes a base layer is formed by an epitaxial crystal growth on the surface part at one side in the thickness direction of an n-type SiC substrate 1.

Then, in the second layer-forming step, a second n-type SiC epitaxial layer 3 is formed by an epitaxial crystal growth on the surface part at one side in the thickness direction of the first n-type SiC epitaxial layer 2 formed in the first layer-forming step.

In the following description, there are cases where the first layer-forming step and the second layer-forming step are combined to be referred to as "the epitaxial layer-forming step". The first n-type SiC epitaxial layer 2 corresponds to a first silicon carbide epitaxial layer. The second n-type SiC epitaxial layer 3 corresponds to a second silicon carbide epitaxial layer.

Then, in the measuring step, layer thicknesses of the first n-type SiC epitaxial layer 2 and the second n-type SiC epitaxial layer 3 are measured by a reflection interference analysis method using a Fourier transform infrared spectrophotometer (Fourier Transform Infrared Spectroscopy; abbreviation: FT-IR) (hereinafter, sometimes referred to as "FT-IR method"). In this context, "a layer thickness" refers to a dimension in the thickness direction of a layer, and in the present embodiment, the layer thicknesses refer to the dimension in the thickness direction of a first n-type SiC epitaxial layer 2 and the dimension in the thickness direction of a second n-type SiC epitaxial layer 3.

In the present embodiment, the first n-type SiC epitaxial layer 2 has an impurity concentration lower than that of the n-type SiC substrate 1. The second n-type SiC epitaxial layer 3 has an impurity concentration lower than that of the first n-type SiC epitaxial layer 2.

It is necessary to set the impurity concentration of the first n-type SiC epitaxial layer 2 to a concentration lower by 20% or more than the impurity concentration of the n-type SiC substrate 1, and it is necessary to set the impurity concentration of the second n-type SiC epitaxial layer 3 to a concentration lower by 20% or more than that of the first n-type SiC epitaxial layer 2.

As described above, in the present embodiment, the n-type SiC substrate 1 and the first n-type SiC epitaxial layer 2 are made to differ in the impurity concentration by 20% or more. Moreover, the first n-type SiC epitaxial layer 2 and the second n-type SiC epitaxial layer 3 are made to differ in the impurity concentration by 20% or more.

Accordingly, in the present embodiment, in the first layer-forming step, the first n-type SiC epitaxial layer 2 is formed so that the rate of change in impurity concentration (hereinafter, sometimes referred to as "rate of impurity concentration-change") between the n-type SiC substrate 1 and the first n-type SiC epitaxial layer 2 will be greater than or equal to 20%. Moreover, in the second layer-forming step, the second n-type SiC epitaxial layer 3 is formed so that the rate of impurity concentration-change between the first n-type SiC epitaxial layer 2 and the second n-type SiC epitaxial layer 3 will be greater than or equal to 20%.

With this setup, in the layer thickness measurement by an FT-IR method in the measuring step, peaks in a spatialgram described below can be separated from one another. Accordingly, it becomes possible to individually obtain the layer thickness of the first n-type SiC epitaxial layer 2 and the layer thickness of the second n-type SiC epitaxial layer 3.

Each of the upper limit value of the rate of impurity concentration-change between the n-type SiC substrate 1 and the first n-type SiC epitaxial layer 2 and the upper limit value of the rate of impurity concentration-change between the first n-type SiC epitaxial layer 2 and the second n-type SiC epitaxial layer 3 is appropriately selected depending on properties required for the SiC epitaxial wafer 10 to be produced.

As previously described, the first n-type SiC epitaxial layer 2 and the second n-type SiC epitaxial layer 3 are formed by an epitaxial crystal growth. In the present embodiment, the SiC epitaxial layer is formed using monosilane and propane as material gases and using nitrogen as a dopant gas. Impurity concentrations of the first n-type SiC epitaxial layer 2 and the second n-type SiC epitaxial layer 3 are controlled by flow rates of the dopant gas in the first layer-forming step and the second layer-forming step which are the steps of forming respective SiC epitaxial layers 2, 3, respectively.

It is desirable that the layer thickness of each of the first n-type SiC epitaxial layer 2 and the second n-type SiC epitaxial layer 3 be greater than or equal to 0.9 μm. In the case where the layer thickness of each of the first n-type SiC epitaxial layer 2 and the second n-type SiC epitaxial layer 3 is less than 0.9 μm, in the layer thickness measurement by an FT-IR method, it becomes difficult for peaks in a spatialgram described below to be separated from one another. Accordingly, it becomes difficult for layer thicknesses of the first n-type SiC epitaxial layer 2 and the second n-type SiC epitaxial layer 3 to be individually measured.

Figure 2:
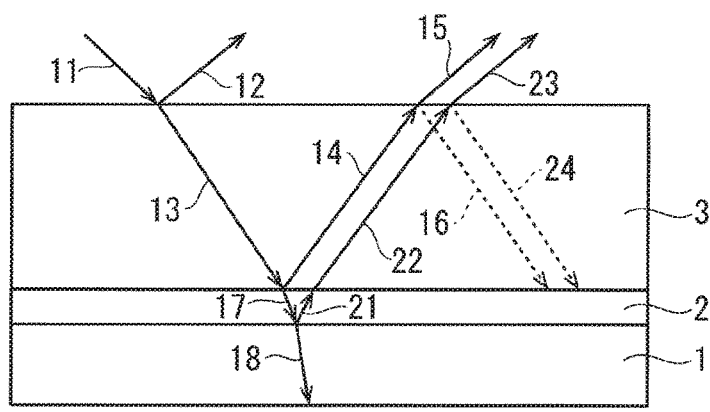
FIG. 2 is a figure schematically showing an example of the optical path for infrared light in the layer thickness measurement by an FT-IR method.

FIG. 2 is a figure schematically showing an example of the optical path for infrared light in the layer thickness measurement by an FT-IR method. In the layer thickness measurement by an FT-IR method, an SiC epitaxial wafer 10 which is a sample for measurement is irradiated with infrared light 11 emitted from a light source which is not illustrated. The infrared light 11 irradiated thereto is divided into light 12 reflected at the surface of the second n-type SiC epitaxial layer 3 which is the first layer (hereinafter, sometimes referred to as "surface-reflected light") and light 13 made incident into the second n-type SiC epitaxial layer 3.

The light 13 made incident into the second n-type SiC epitaxial layer 3 is divided into light 14 reflected at the interface between the first n-type SiC epitaxial layer 2 and the second n-type SiC epitaxial layer 3 and light 17 made incident into the first n-type SiC epitaxial layer 2.

The light 14 reflected at the interface between the first n-type SiC epitaxial layer 2 and the second n-type SiC epitaxial layer 3 travels through the second n-type SiC epitaxial layer 3 and reaches the surface of the second n-type SiC epitaxial layer 3 which is the surface of the sample for measurement. The light 14 that reaches the surface of the second n-type SiC epitaxial layer 3 is divided into light 15 transmitted through the surface of the second n-type SiC epitaxial layer 3 to be emitted from the surface thereof and light 16 reflected at the surface of the second n-type SiC epitaxial layer 3.

Since the light 15 thus transmitted through the surface of the second n-type SiC epitaxial layer 3 to be emitted from the surface thereof is light reflected at the interface between the first n-type SiC epitaxial layer 2 and the second n-type SiC epitaxial layer 3, in the following description, the light is sometimes referred to as "layer interface-reflected light".

The light 17 made incident into the first n-type SiC epitaxial layer 2 is divided into light 21 reflected at the interface between the n-type SiC substrate 1 and the first n-type SiC epitaxial layer 2 and light 18 made incident into the n-type SiC substrate 1.

The light 21 reflected at the interface between the n-type SiC substrate 1 and the first n-type SiC epitaxial layer 2 travels through the first n-type SiC epitaxial layer 2 and reaches the interface between the first n-type SiC epitaxial layer 2 and the second n-type SiC epitaxial layer 3.

Among beams of light 21 that reaches the interface between the first n-type SiC epitaxial layer 2 and the second n-type SiC epitaxial layer 3, a beam of light 22 transmitted through the interface travels through the first n-type SiC epitaxial layer 2 and reaches the surface of the second n-type SiC epitaxial layer 3 which is the surface of the sample for measurement. The light 22 that reaches the surface of the second n-type SiC epitaxial layer 3 is divided into light 23 transmitted through the surface of the second n-type SiC epitaxial layer 3 to be emitted from the surface thereof and light 24 reflected at the surface of the second n-type SiC epitaxial layer 3.

Since the light 23 thus transmitted through the surface of the second n-type SiC epitaxial layer 3 to be emitted from the surface thereof is light reflected at the interface between the n-type SiC substrate 1 and the first n-type SiC epitaxial layer 2, in the following description, the light is sometimes referred to as "substrate interface-reflected light".

In the layer thickness measurement by an FT-IR method, from an interference waveform between the surface-reflected light 12 and the layer interface-reflected light 15 and an interference waveform between the surface-reflected light 12 and the substrate interface-reflected light 23, layer thicknesses of the first n-type SiC epitaxial layer 2 and the second n-type SiC epitaxial layer 3 are derived.

In the layer thickness measurement by an FT-IR method, an interference spectrum called an interferogram is obtained. The interferogram obtained is Fourier-transformed to obtain an interference waveform represented by a reflection factor and a wave number.

Figure 3:
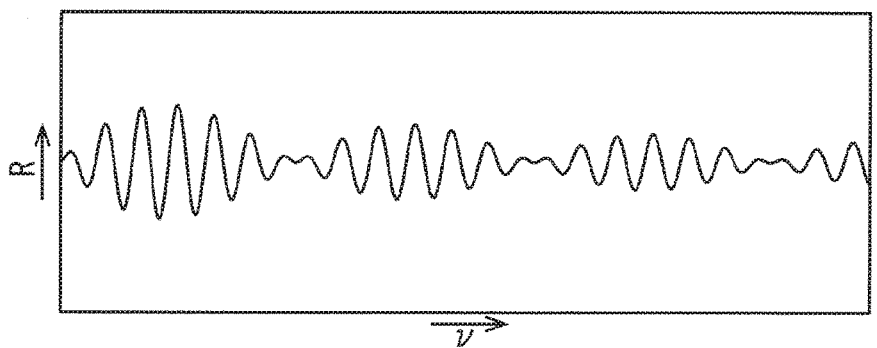
FIG. 3 is a figure showing an interference waveform in the case where both of reflection intensity of layer interface-reflected light 15 and reflection intensity of substrate interface-reflected light 23 shown in FIG. 2 are sufficiently obtained.
Figure 4:
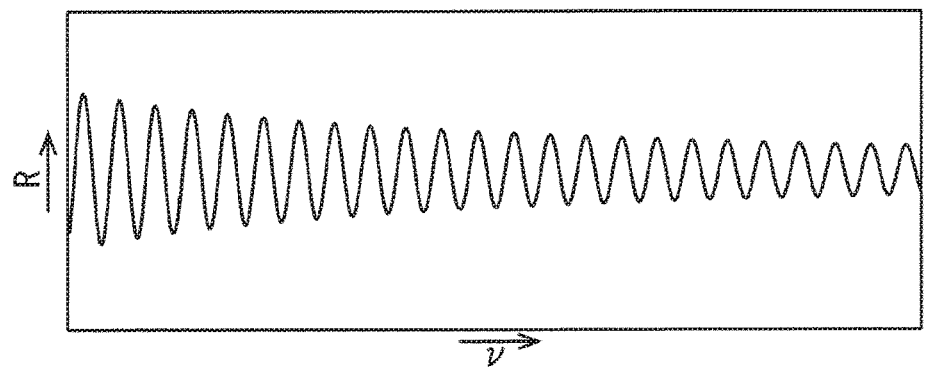
FIG. 4 is a figure showing an interference waveform in the case where reflection intensity of any one of layer interface-reflected light 15 and substrate interface-reflected light 23 shown in FIG. 2 is sufficiently obtained and reflection intensity of the other thereof is not sufficiently obtained.

FIG. 3 and FIG. 4 are figures showing a waveform in a wave number range used for analysis among Fourier-transformed interferograms.

FIG. 3 is a figure showing an interference waveform in the case where reflection intensity of the layer interface-reflected light 15 and reflection intensity of the substrate interface-reflected light 23 shown in FIG. 2 are sufficiently obtained. FIG. 4 is a figure showing an interference waveform in the case where reflection intensity of any one of the layer interface-reflected light 15 and the substrate interface-reflected light 23 shown in FIG. 2 is sufficiently obtained and reflection intensity of the other thereof is not sufficiently obtained.

In FIG. 3 and FIG. 4, the horizontal axis indicates the wave number ν and the vertical axis indicates the reflection factor R. As shown in FIG. 3 and FIG. 4, in a Fourier-transformed interferogram, the reflection factor R is attenuated depending on the wave number ν. This is because the absorption of light occurs inside a substance. In the present embodiment, since the absorption of light occurs in the insides of the n-type SiC substrate 1, the first n-type SiC epitaxial layer 2 and the second n-type SiC epitaxial layer 3, the reflection factor R is attenuated depending on the wave number ν.

Figure 5:
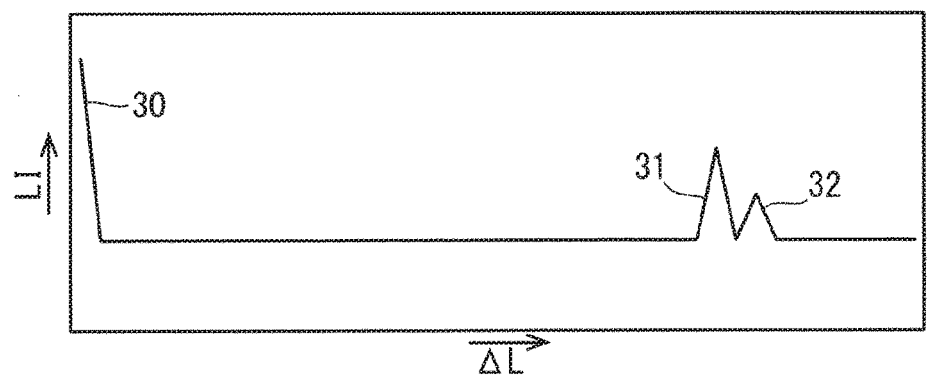
FIG. 5 is a figure showing a spatialgram in the case where both of reflection intensity of layer interface-reflected light 15 and reflection intensity of substrate interface-reflected light 23 shown in FIG. 2 are sufficiently obtained.
Figure 6:
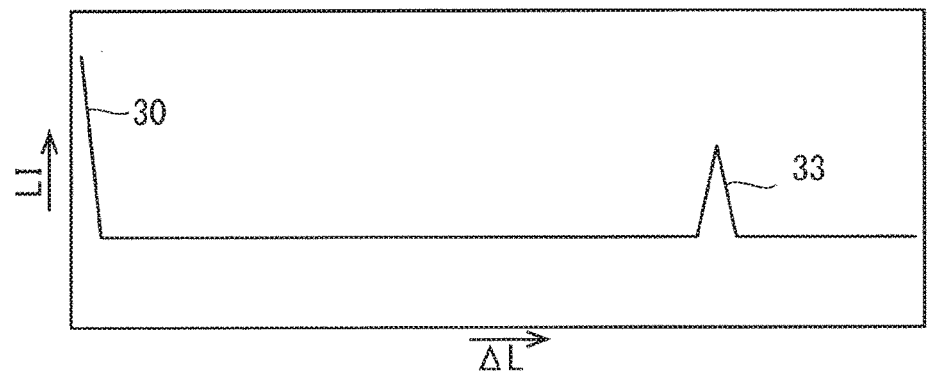
FIG. 6 is a figure showing a spatialgram in the case where reflection intensity of any one of layer interface-reflected light 15 and substrate interface-reflected light 23 shown in FIG. 2 is sufficiently obtained and reflection intensity of the other thereof is not sufficiently obtained.

A waveform in a wave number range used for analysis among Fourier-transformed interferograms is Fourier-transformed to obtain such a waveform, which is called a spatialgram, shown in FIG. 5 and FIG. 6.

FIG. 5 and FIG. 6 are figures showing an example of the spatialgram. FIG. 5 is a figure showing a spatialgram in the case where both of reflection intensity of the layer interface-reflected light 15 and reflection intensity of the substrate interface-reflected light 23 shown in FIG. 2 are sufficiently obtained. FIG. 6 is a figure showing a spatialgram in the case where reflection intensity of any one of the layer interface-reflected light 15 and the substrate interface-reflected light 23 shown in FIG. 2 is sufficiently obtained and reflection intensity of the other thereof is not sufficiently obtained.

In FIG. 5 and FIG. 6, the horizontal axis indicates the optical path difference ΔL and the vertical axis indicates the light intensity LI. As shown in FIG. 5, in the case where both of the layer interface-reflected light 15 and the substrate interface-reflected light 23 are obtained, a waveform in which interference waveforms thereof are summed up is obtained as a spatialgram.

In FIG. 5 and FIG. 6, a peak indicated by the reference sign "30" is called a center burst. Since the center burst 30 has an optical path difference ΔL of zero, beams of reflected light are summed up to generate a peak which is high in reflection intensity. Peaks indicated by the reference signs "31", "32", "33" are called side bursts. The side bursts 31, 32, 33 are peaks obtained from the surface-reflected light 12 reflected at the surface of the sample for measurement and the layer interface-reflected light 15 or the substrate interface-reflected light 23.

In the layer thickness measurement by an FT-IR method, the layer thickness is calculated by dividing the optical path difference ΔL between the center burst 30 and each of the side bursts 31, 32, 33 by the refractive index.

As previously described, in the present embodiment, the n-type SiC substrate 1 and the first n-type SiC epitaxial layer 2 are made to differ in the impurity concentration by 20% or more, and the first n-type SiC epitaxial layer 2 and the second n-type SiC epitaxial layer 3 are made to differ in the impurity concentration by 20% or more. With this setup, in the layer thickness measurement by an FT-IR method, the layer thickness of the first n-type SiC epitaxial layer 2 and the layer thickness of the second n-type SiC epitaxial layer 3 can be individually obtained. The reason therefor will be described below with reference to FIG. 7 and FIG. 8.

Figure 7:
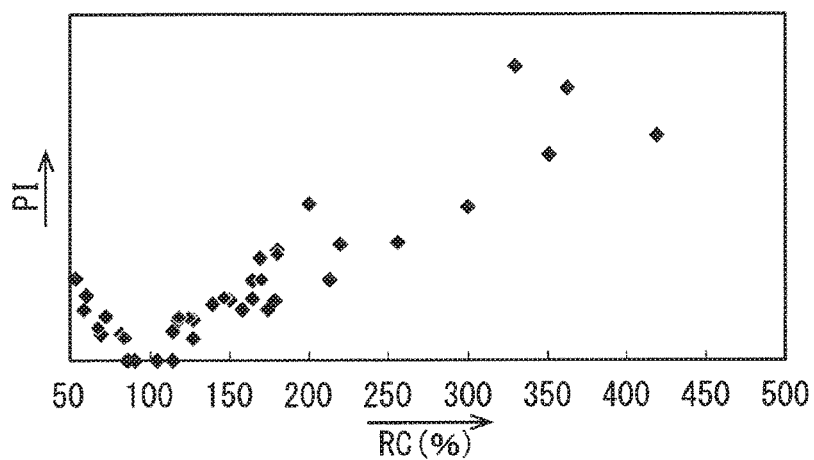
FIG. 7 is a correlation diagram showing the relationship between the peak intensity PI of a side burst in a spatialgram obtained by the layer thickness measurement by an FT-IR method and the rate of change RC in the impurity concentration between two adjacent SiC members.
Figure 8:
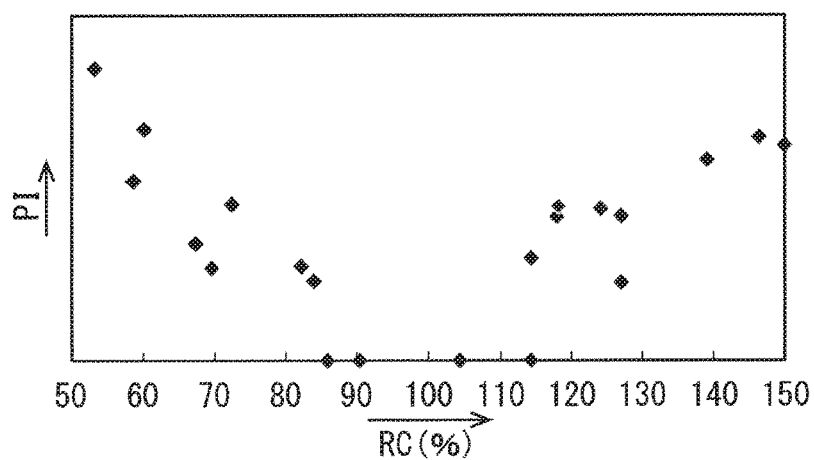
FIG. 8 is a figure showing an enlarged portion of the correlation diagram shown in FIG. 7 where the rate of impurity concentration-change lies within the range of 50 to 150%.

FIG. 7 is a correlation diagram showing the relationship between the peak intensity PI of a side burst in a spatialgram obtained by the layer thickness measurement by an FT-IR method and the rate of change RC in the impurity concentration between two adjacent SiC members. FIG. 8 is a figure showing an enlarged portion of the correlation diagram shown in FIG. 7 where the rate of impurity concentration-change lies within the range of 50 to 150%.

In this context, "between two adjacent SiC members" refers to between an SiC substrate and an SiC epitaxial layer adjacent to each other or between two adjacent SiC epitaxial layers. In the present embodiment, "between two adjacent SiC members" refers to between the n-type SiC substrate 1 and the first n-type SiC epitaxial layer 2 or between the first n-type SiC epitaxial layer 2 and the second n-type SiC epitaxial layer 3.

In FIG. 7 and FIG. 8, the relationship between the peak intensity PI of any one of side bursts 31 to 33 in a spatialgram obtained by subjecting SiC epitaxial wafers 10 produced by changing the impurity concentration to the layer thickness measurement by an FT-IR method and the rate of impurity concentration-change RC between two adjacent SiC members is shown.

In FIG. 7 and FIG. 8, the horizontal axis indicates the rate of impurity concentration-change RC (%) and the vertical axis indicates the peak intensity PI. The peak intensity PI is relative, and the unit of the peak intensity PI is an arbitrary unit. In FIG. 7 and FIG. 8, a value calculated by dividing the impurity concentration of one SiC member among two adjacent SiC members by the impurity concentration of the other SiC member to be represented in percentage is shown as the rate of impurity concentration-change RC.

The impurity concentration of an n-type SiC substrate 1 varies depending on the material manufacturer. In the present embodiment, $1 \times 10^{19}$ cm$^{-3}$, which is a standard value of the impurity concentration of the n-type SiC substrate 1 used, is used as the impurity concentration of the n-type SiC substrate 1 to calculate the rate of impurity concentration-change.

The impurity concentration of a first n-type SiC epitaxial layer 2 can be measured by a CV method (capacitance voltage method) after forming the first n-type SiC epitaxial layer 2 and before forming a second n-type SiC epitaxial layer 3.

Since a second n-type SiC epitaxial layer 3 is layered on the first n-type SiC epitaxial layer 2 to be formed, the impurity concentration of the second n-type SiC epitaxial layer 3 cannot be directly measured by a CV method. Accordingly, in the present embodiment, the impurity concentration of an epitaxial layer subjected to epitaxial crystal growth under a condition similar to that for the second n-type SiC epitaxial layer 3 is determined by a CV method, and a value of the impurity concentration determined is used as a predicted value of the impurity concentration of the second n-type SiC epitaxial layer 3.

In FIG. 8, in the case where the rate of impurity concentration-change RC is 86%, the peak intensity PI is allowed to be zero. Allowing the peak intensity PI to be zero indicates failing to sufficiently obtain reflection intensity of the substrate interface-reflected light 23 from the interface between the n-type SiC substrate 1 and the first n-type SiC epitaxial layer 2 and reflection intensity of the layer interface-reflected light 15 from the interface between the first n-type SiC epitaxial layer 2 and the second n-type SiC epitaxial layer 3. In this case, it is impossible to individually measure the layer thickness of the first n-type SiC epitaxial layer 2 and the layer thickness of the second n-type SiC epitaxial layer 3.

In contrast, in the case where the rate of impurity concentration-change RC is 84%, the peak intensity PI is not allowed to be zero and has a certain degree of value. This indicates enabling a peak to be obtained in the layer thickness measurement by an FT-IR method and enabling reflection intensity of the substrate interface-reflected light 23 from the interface between the n-type SiC substrate 1 and the first n-type SiC epitaxial layer 2 and reflection intensity of the layer interface-reflected light 15 from the interface between the first n-type SiC epitaxial layer 2 and the second n-type SiC epitaxial layer 3 to be sufficiently obtained. In this case, it is possible to individually measure the layer thickness of the first n-type SiC epitaxial layer 2 and the layer thickness of the second n-type SiC epitaxial layer 3.

Moreover, in FIG. 8, in the case where the rate of impurity concentration-change RC is 90%, the case where the rate of impurity concentration-change RC is 104% and the case where the rate of impurity concentration-change RC is 114%, as in the above-described case where the rate of impurity concentration-change RC is 86%, the peak intensity PI is allowed to be zero.

In contrast, in the case where the rate of impurity concentration-change RC is less than or equal to 80% and the case where the rate of impurity concentration-change RC is greater than or equal to 120%, as in the above-described case where the rate of impurity concentration-change RC is 84%, the peak intensity PI is not allowed to be zero and has a certain degree of value.

From the above, in FIG. 8, it is found that the peak intensity PI is sufficiently obtained and it is possible to individually measure the layer thickness of the first n-type SiC epitaxial layer 2 and the layer thickness of the second n-type SiC epitaxial layer 3 as long as the rate of impurity concentration-change RC lies within a portion excluding the range of 100%±20% (exclusive of 120% and 80%), that is, the rate of impurity concentration-change RC lies within the range of less than or equal to 80% or the range of greater than or equal to 120%.

As previously described, in FIG. 7 and FIG. 8, a value calculated by dividing the impurity concentration of one SiC member among two adjacent SiC members by the impurity concentration of the other SiC member to be represented in percentage is shown as the rate of impurity concentration-change RC.

Accordingly, the range in which the rate of impurity concentration-change RC is less than or equal to 80% refers to the range in which the impurity concentration of one SiC member among two adjacent SiC members is lower by 20% or more than the impurity concentration of the other SiC member. Moreover, the range in which the rate of impurity concentration-change RC is greater than or equal to 120% refers to the range in which the impurity concentration of one SiC member among two adjacent SiC members is higher by 20% or more than the impurity concentration of the other SiC member.

In this context, as previously described, "two adjacent SiC members" refer to an SiC substrate and an SiC epitaxial layer adjacent to each other or two adjacent SiC epitaxial layers. In the present embodiment, "two adjacent SiC members" refer to the n-type SiC substrate 1 and the first n-type SiC epitaxial layer 2 or the first n-type SiC epitaxial layer 2 and the second n-type SiC epitaxial layer 3.

Accordingly, in the present embodiment, each of the rate of impurity concentration-change RC between the n-type SiC substrate 1 and the first n-type SiC epitaxial layer 2 and the rate of impurity concentration-change RC between the first n-type SiC epitaxial layer 2 and the second n-type SiC epitaxial layer 3, each of which is the rate of impurity concentration-change RC between two adjacent SiC members, is set to 20% or more.

In this way, a peak attributed to the substrate interface-reflected light 23 reflected at the interface between the n-type SiC substrate 1 and the first n-type SiC epitaxial layer 2 and a peak attributed to the layer interface-reflected light 15 reflected at the interface between the first n-type SiC epitaxial layer 2 and the second n-type SiC epitaxial layer 3 can be separated from each other. With this setup, as previously described, it is possible to individually measure the layer thickness of the first n-type SiC epitaxial layer 2 and the layer thickness of the second n-type SiC epitaxial layer 3.

Figure 9:
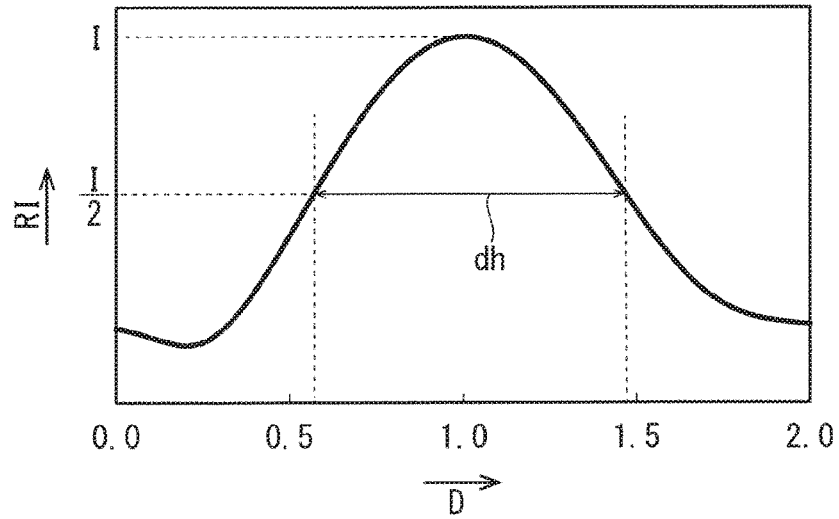
FIG. 9 is a figure showing a portion where a first side burst 31 shown in FIG. 5 is enlarged and the optical path difference ΔL as the horizontal axis is converted into the layer thickness D.

FIG. 9 is a figure showing a portion where a first side burst 31 shown in FIG. 5 is enlarged and the optical path difference $\Delta L$ as the horizontal axis is converted into the layer thickness D. Also in the case where a second side burst 32 shown in FIG. 5 is enlarged, a figure which is the same as that in FIG. 9 is obtained. In FIG. 9, the horizontal axis indicates the value D calculated by converting the optical path difference $\Delta L$ into the layer thickness of an SiC epitaxial layer and the vertical axis indicates the reflection intensity RI. The reflection intensity RI is relative, and the unit of the reflection intensity RI is an arbitrary unit.

From FIG. 9, it is found that the half-value width dh of a peak, that is, the layer thickness D of an SiC epitaxial layer at the time when a peak value I of the reflection intensity RI becomes I/2 which is one-half thereof, is about 0.9 μm. This demonstrates the following. When the layer thickness of an SiC epitaxial layer is greater than or equal to 0.9 μm, peaks separated from each other are obtained at the stage of the spatialgram. For example, as shown in the above-described FIG. 5, the side bursts 31, 32 separated from each other are obtained. Accordingly, it is possible to individually measure the layer thicknesses of the first n-type SiC epitaxial layer 2 and the second n-type SiC epitaxial layer 3.

In the case where the layer thickness of each of the first n-type SiC epitaxial layer 2 and the second n-type SiC epitaxial layer 3 is less than 0.9 µm, peaks separated from each other at the stage of the spatialgram are not obtained. For example, as shown in the above-described FIG. 6, only one side burst 33 is obtained. Accordingly, peak values cannot be directly read from a spatialgram to individually measure the layer thicknesses of the first n-type SiC epitaxial layer 2 and the second n-type SiC epitaxial layer 3.

However, since the light intensity LI is obtained from two reflected waves overlapped with each other, by analyzing a spatialgram, even when the layer thickness of each of the first n-type SiC epitaxial layer 2 and the second n-type SiC epitaxial layer 3 is less than 0.9 µm, in the case of the layer thickness of 0.5 µm or so, it is possible to individually measure the layer thicknesses of the first n-type SiC epitaxial layer 2 and the second n-type SiC epitaxial layer 3.

The upper limit value of the layer thickness of each of the first n-type SiC epitaxial layer 2 and the second n-type SiC epitaxial layer 3 is appropriately selected depending on properties required for the SiC epitaxial wafer 10 to be produced.

In the epitaxial layer-forming step, the impurity concentration of each of the first n-type SiC epitaxial layer 2 and the second n-type SiC epitaxial layer 3 may be adjusted by the flow adjustment of the above-described dopant gas and may be adjusted by the modification of the flow ratio of material gases or the modification of process parameters such as growth temperature and growth rate. Moreover, as the gas used for the growth of each of the first n-type SiC epitaxial layer 2 and the second n-type SiC epitaxial layer 3, other silane-based gases, hydrocarbon gases and a dopant gas may be used, and the same effect as that in the present embodiment is obtained.

In the embodiment described above, although the case of producing an n-type SiC epitaxial wafer is described, the manufacturing method can be performed in the same manner also in the case of producing a p-type SiC epitaxial wafer and the same effect can be obtained.

Moreover, in the present embodiment, the n-type SiC substrate 1, the first n-type SiC epitaxial layer 2 and the second n-type SiC epitaxial layer 3 are set in this order so as to become lower in the impurity concentration. The n-type SiC substrate 1, the first n-type SiC epitaxial layer 2 and the second n-type SiC epitaxial layer 3 do not necessarily need to be set in this order so as to become lower in the impurity concentration.

Figure 10:
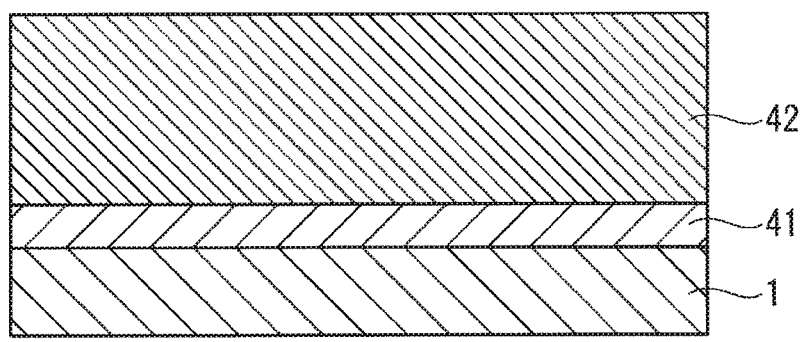
FIG. 10 is a sectional view showing a silicon carbide epitaxial wafer 40 which is another example of the silicon carbide epitaxial wafer.

FIG. 10 is a sectional view showing a silicon carbide epitaxial wafer 40 which is another example of the silicon carbide epitaxial wafer. For example, like the silicon carbide (SiC) epitaxial wafer 40 shown in FIG. 10, a first n-type SiC epitaxial layer 41 which is lower in the impurity concentration than an n-type SiC substrate 1 may be formed on the surface part at one side in the thickness direction of the n-type SiC substrate 1, and a second n-type SiC epitaxial layer 42 which is higher in the impurity concentration than the first n-type SiC epitaxial layer 41 may be formed on the surface part at one side in the thickness direction of the first n-type SiC epitaxial layer 41. The first n-type SiC epitaxial layer 41 corresponds to a first silicon carbide epitaxial layer. The second n-type SiC epitaxial layer 42 corresponds to a second silicon carbide epitaxial layer.

Moreover, the first n-type SiC epitaxial layer 41 may be higher in the impurity concentration than the n-type SiC substrate 1 and may be higher in the impurity concentration than the second n-type SiC epitaxial layer 42. Moreover, the n-type SiC substrate 1, the first n-type SiC epitaxial layer 41 and the second n-type SiC epitaxial layer 42 may be set in this order so as to become higher in the impurity concentration.

Also in the configuration of the SiC epitaxial wafer 40 shown in FIG. 10, the same effect as that in the present embodiment can be obtained as long as the rate of impurity concentration-change between two adjacent SiC members is greater than or equal to 20%. In FIG. 10, "between two adjacent SiC members" refers to between the n-type SiC substrate 1 and the first n-type SiC epitaxial layer 41 or between the first n-type SiC epitaxial layer 41 and the second n-type SiC epitaxial layer 42.

Specifically, as shown in the above-described FIG. 8, in the case where the rate of impurity concentration-change is 120%, that is, in the case where the impurity concentration of the second n-type SiC epitaxial layer 42 which is an upper layer is higher than that of the first n-type SiC epitaxial layer 41 which constitutes a base layer, sufficient peak intensity is obtained. Accordingly, even if the magnitude relation of impurity concentrations is inverted as compared with the present embodiment, since it is possible to separate peaks from each other as long as the rate of impurity concentration-change is greater than or equal to 20%, layer thicknesses of the first n-type SiC epitaxial layer 41 and the second n-type SiC epitaxial layer 42 can be individually measured.

Figure 11:
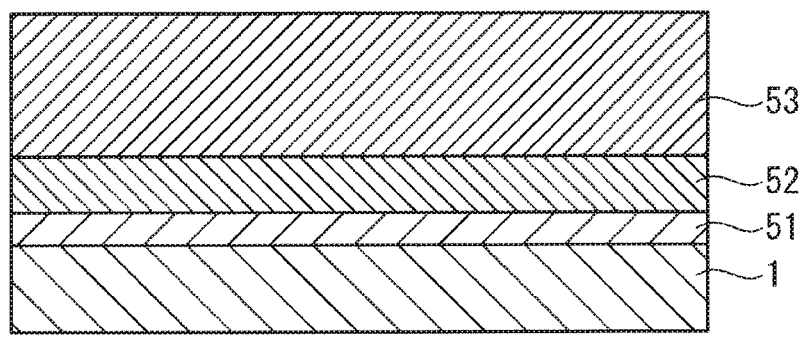
FIG. 11 is a sectional view showing a silicon carbide epitaxial wafer 50 which is yet another example of the silicon carbide epitaxial wafer.

FIG. 11 is a sectional view showing a silicon carbide epitaxial wafer 50 which is yet another example of the silicon carbide epitaxial wafer. Like the silicon carbide (SiC) epitaxial wafer 50 shown in FIG. 11, three or more SiC epitaxial layers may be formed on the surface part at one side in the thickness direction of the n-type SiC substrate 1.

In this case, in the first layer-forming step, a first n-type SiC epitaxial layer 51 which constitutes a base layer is formed on the surface part at one side in the thickness direction of the n-type SiC substrate 1. Then, in the second layer-forming step, a second n-type SiC epitaxial layer 52 is formed on the surface part at one side in the thickness direction of the first n-type SiC epitaxial layer 51. Then, in an additional layer-forming step, a third n-type SiC epitaxial layer 53 is formed on the surface part at one side in the thickness direction of the second n-type SiC epitaxial layer 52.

The first n-type SiC epitaxial layer 51 corresponds to a first silicon carbide epitaxial layer. The second n-type SiC epitaxial layer 52 corresponds to a second silicon carbide epitaxial layer. The third n-type SiC epitaxial layer 53 corresponds to an additional silicon carbide epitaxial layer.

Like the configuration of the SiC epitaxial wafer 50 shown in FIG. 11, even if the wafer is a multilayer wafer of three or more layers, the same effect as that in the present embodiment can be obtained as long as the rate of impurity concentration-change between two adjacent SiC members is greater than or equal to 20%. In FIG. 11, "between two adjacent SiC members" refers to between the n-type SiC substrate 1 and the first n-type SiC epitaxial layer 51, between the first n-type SiC epitaxial layer 51 and the second n-type SiC epitaxial layer 52 or between the second n-type SiC epitaxial layer 52 and the third n-type SiC epitaxial layer 53.

As shown in FIG. 11, in the case where three or more n-type SiC epitaxial layers are formed, as in the case of that shown in FIG. 10, any combination in the magnitude relation of impurity concentrations is acceptable.

For example, the impurity concentration of the first n-type SiC epitaxial layer 51 may be lower than each of the impurity concentration of the n-type SiC substrate 1 and the impurity concentration of the second n-type SiC epitaxial layer 52, and the impurity concentration of the second n-type SiC epitaxial layer 52 may be higher than the impurity concentration of the third n-type SiC epitaxial layer 53.

In this connection, with regard to the present invention, in the scope of the invention, it is possible to properly change or omit any constituent element of the embodiment.

Although the present invention has been described in detail, with regard to the description mentioned above, all aspects are merely illustrative, and the present invention should not be limited thereto. It is understood that countless modified examples which are not exemplified can be assumed not to depart from the scope of the present invention.

REFERENCE SIGNS LIST

1: n-type silicon carbide (SiC) substrate,
2, 41, 51: first n-type silicon carbide (SiC) epitaxial layer,
3, 42, 52: second n-type silicon carbide (SiC) epitaxial layer,
10, 40, 50: silicon carbide (SiC) epitaxial wafer,
53: third n-type silicon carbide (SiC) epitaxial layer.

The invention claimed is:

1. A method of manufacturing a silicon carbide epitaxial wafer, comprising:
   a first layer-forming step of forming a first silicon carbide epitaxial layer by an epitaxial crystal growth on the surface part at one side in the thickness direction of a silicon carbide substrate;
   a second layer-forming step of forming a second silicon carbide epitaxial layer by an epitaxial crystal growth on the surface part at one side in the thickness direction of said first silicon carbide epitaxial layer formed; and
   a measuring step of measuring layer thicknesses of said first silicon carbide epitaxial layer and said second silicon carbide epitaxial layer by a reflection interference analysis using a Fourier transform infrared spectrophotometer,
   wherein, in said first layer-forming step, said first silicon carbide epitaxial layer is formed so that the rate of change in impurity concentration between said silicon carbide substrate and said first silicon carbide epitaxial layer will be greater than or equal to 20%,
   in said second layer-forming step, said second silicon carbide epitaxial layer is formed so that the rate of change in impurity concentration between said first silicon carbide epitaxial layer and said second silicon carbide epitaxial layer will be greater than or equal to 20%, and
   said first silicon carbide epitaxial layer and said second silicon each have a layer thickness that is sufficient to, in response to irradiating light toward a surface of said second silicon carbide epitaxial layer during said measuring step, produce, in a spatialgram, a side burst having peaks that exist on one side of a center burst along an optical path difference ΔL and are separated from the center burst and each other.

2. The method of manufacturing a silicon carbide epitaxial wafer according to claim 1, wherein,
   in said first layer-forming step, said first silicon carbide epitaxial layer is formed so that the impurity concentration of said first silicon carbide epitaxial layer will be lower than the impurity concentration of said silicon carbide substrate, and
   in said second layer-forming step, said second silicon carbide epitaxial layer is formed so that the impurity concentration of said second silicon carbide epitaxial layer will be lower than the impurity concentration of said first silicon carbide epitaxial layer.

3. The method of manufacturing a silicon carbide epitaxial wafer according to claim 1, wherein,
   in said first layer-forming step, said first silicon carbide epitaxial layer is formed so that the impurity concentration of said first silicon carbide epitaxial layer will be lower than the impurity concentration of said silicon carbide substrate, and
   in said second layer-forming step, said second silicon carbide epitaxial layer is formed so that the impurity concentration of said second silicon carbide epitaxial layer will be higher than the impurity concentration of said first silicon carbide epitaxial layer.

4. The method of manufacturing a silicon carbide epitaxial wafer according to claim 1, wherein the layer thickness of each of said first silicon carbide epitaxial layer and said second silicon carbide epitaxial layer is greater than or equal to 0.9 μm.

5. The method of manufacturing a silicon carbide epitaxial wafer according to claim 1, further comprising
   an additional layer-forming step of forming one or more additional silicon carbide epitaxial layer(s), after said second layer-forming step and before said measuring step, by an epitaxial crystal growth on the surface part at one side in the thickness direction of said second silicon carbide epitaxial layer formed,
   wherein, in said additional layer-forming step, said additional silicon carbide epitaxial layer is formed so that the rate of change in impurity concentration between said silicon carbide epitaxial layers adjacent to each other will be greater than or equal to 20%, and
   in said measuring step, layer thicknesses of said first silicon carbide epitaxial layer, said second silicon carbide epitaxial layer and said additional silicon carbide epitaxial layer are measured.

6. The method of manufacturing a silicon carbide epitaxial wafer according to claim 5, wherein the layer thickness of each of said first silicon carbide epitaxial layer, said second silicon carbide epitaxial layer and said additional silicon carbide epitaxial layer is greater than or equal to 0.9 μm.

* * * * *